US008276105B2

(12) United States Patent
Keinert et al.

(10) Patent No.: US 8,276,105 B2
(45) Date of Patent: Sep. 25, 2012

(54) AUTOMATIC POSITIONING OF GATE ARRAY CIRCUITS IN AN INTEGRATED CIRCUIT DESIGN

(75) Inventors: Joachim Keinert, Altdorf (DE); Douglass T. Lamb, Cary, NC (US); David W. Lewis, Pleasant Valley, NY (US); Shyam Ramji, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 391 days.

(21) Appl. No.: 12/563,021

(22) Filed: Sep. 18, 2009

(65) Prior Publication Data

US 2011/0072407 A1    Mar. 24, 2011

(51) Int. Cl.
    G06F 17/50    (2006.01)
(52) U.S. Cl. .............. 716/55; 716/119; 716/139
(58) Field of Classification Search .......... 716/55, 716/119, 139
    See application file for complete search history.

(56) References Cited

U.S. PATENT DOCUMENTS

| | | | |
|---|---|---|---|
| 4,613,958 A | 9/1986 | Culican et al. | |
| 4,686,629 A | 8/1987 | Noto et al. | |
| 5,323,033 A | 6/1994 | Matsumoto et al. | |
| 5,687,325 A | 11/1997 | Chang | |
| 5,946,219 A | 8/1999 | Mason et al. | |
| 5,959,905 A | 9/1999 | Payne | |
| 6,173,434 B1 | 1/2001 | Wirthlin et al. | |
| 6,223,332 B1 | 4/2001 | Scepanovic et al. | |
| 6,226,775 B1 | 5/2001 | Yamada | |
| 6,321,371 B1 | 11/2001 | Yount, Jr. | |
| 6,446,248 B1 | 9/2002 | Solomon et al. | |
| 7,036,103 B2 | 4/2006 | Miller et al. | |
| 7,266,796 B1 | 9/2007 | Chu et al. | |
| 7,444,609 B2 | 10/2008 | Charlebois et al. | |
| 7,480,888 B1 | 1/2009 | Ogilvie et al. | |
| 7,516,303 B2 | 4/2009 | Kundu et al. | |
| 8,051,400 B2 * | 11/2011 | Frederick | 716/119 |
| 2004/0268288 A1 | 12/2004 | Bajuk et al. | |
| 2005/0210435 A1 | 9/2005 | Zorrilla et al. | |
| 2006/0190908 A1 | 8/2006 | Bajuk et al. | |
| 2007/0257923 A1 | 11/2007 | Whitby-Strevens | |

OTHER PUBLICATIONS

Choy et al., "Incremental Layout Placement Modification Algorithms", IEEE Transactions on Computer-Aided Design of Integrated Circuits and Systems, vol. 15, No. 4, Apr. 1996, pp. 437-445.
Li et al., "Incremental Placement Algorithm for Standard-Cell Layout", 2002 IEEE International Symposium on Circuits and Systems, May 2002, Scottsdale AZ, vol. 2, pp. II-883-II-886.
Kahng et al., "Optimization of Linear Placements for Wirelength Minimization with Free Sites", (ASP-DAC'99) Asia and South Pacific Design Automation Conference, 1999, pp. 241-244.

\* cited by examiner

*Primary Examiner* — Thaun Do
(74) *Attorney, Agent, or Firm* — Yee & Associates, P.C.; Daniel H. Schurmann

(57) ABSTRACT

An automated method and apparatus for positioning gate array circuits in an integrated circuit design. An initial integrated circuit design includes logic cells and gate array fill circuits positioned thereon. The gate array fill circuits are positioned in available space between the adjacent logic cells so as to fill the available space with the maximum gate array fill circuits. A gate array logic element to be positioned in the integrated circuit design, such as may be required by an engineering change to the circuit design, is automatically positioned between adjacent logic cells so as to allow for full utilization of any space remaining between the adjacent logic cells by gate array fill circuits.

17 Claims, 7 Drawing Sheets

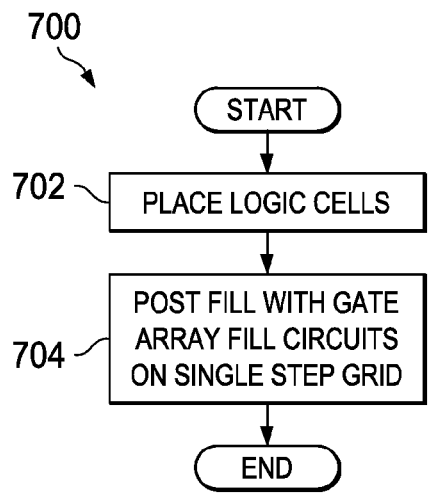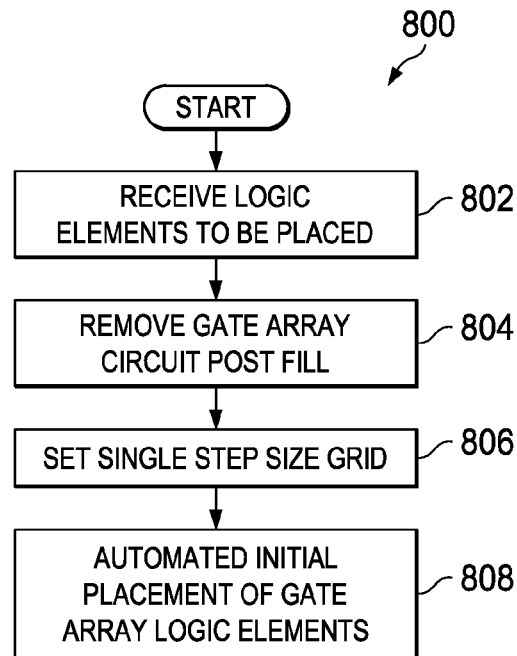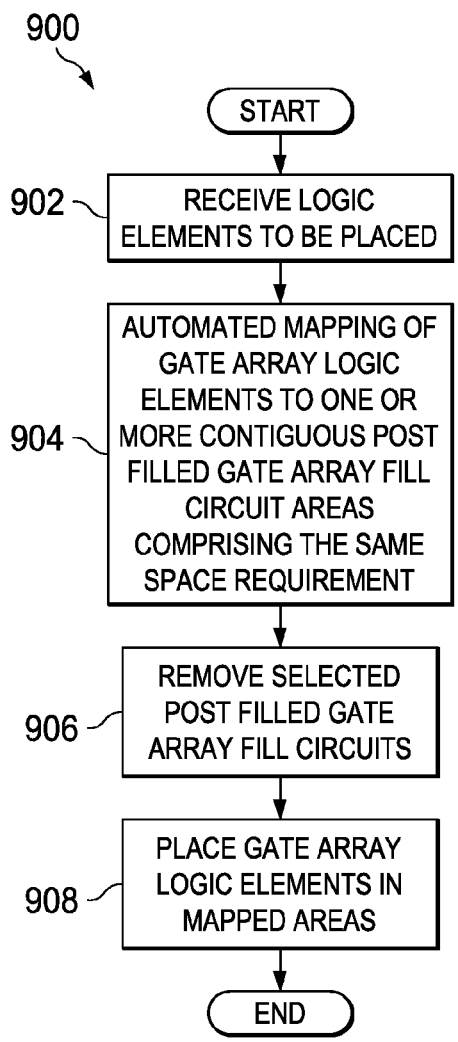
FIG. 7
FIG. 8
FIG. 9

AUTOMATIC POSITIONING OF GATE ARRAY CIRCUITS IN AN INTEGRATED CIRCUIT DESIGN

BACKGROUND

1. Field

This disclosure relates generally to integrated circuit design, and more specifically to the placement of gate array circuits in an integrated circuit design.

2. Description of the Related Art

Logic synthesis is a computer implemented process that transforms a circuit description from one level of abstraction to a lower level, usually towards the physical implementation of an integrated circuit. As a result of the logic synthesis process, logic cells or logic functions are arranged physically on an integrated circuit chip in multiple circuit rows and/or circuit columns in order to form the completed design. Each circuit row and/or circuit column on the integrated circuit chip contains multiple logic cells that are arranged adjacent to one another.

After the logic cells are positioned in the integrated circuit chip design, gaps or empty spaces are likely to remain between certain adjacent logic cells. These empty spaces, sometimes referred to as "white spaces", exist in random locations and are of random sizes within the circuit design layout.

Filler cells may be established within the empty white spaces. Filler cells are functional cells that are added to the integrated circuit design layout to fill the empty spaces between the logic cells within the circuit rows and/or circuit columns of the original circuit design, or nonfunctional cells that only contain shapes to maintain uniformity during manufacturing. A functional filler cell may include, for example, one or more passive electronic devices, such as resistors or decoupling capacitors, or one or more active electronic devices, such as standard logic gates. The size of the physical area of the filler cell determines the scope of functionality that may be incorporated therein. For example, a filler cell of a certain size may allow only for the incorporation of a non-functional cell. By contrast, a filler cell of a certain larger size may allow the incorporation of a more complex logic function, such as a gate array fill circuit.

Gate array fill circuits, in the context of integrated circuit design, are customizable devices that are formed of transistors. Gate array fill circuits are formed as configurations of electrical substrate, diffusion layer, and gate layer formed in a regular pattern on a semiconductor chip. Gate array fill circuits are configurable into gate array logic elements by "back end of line" process steps that are performed late in the integrated circuit manufacturing process, such as metal and metal-to-metal cut layer deposition. Such customizable gate array fill circuits are very useful to have available as part of an integrated circuit chip design.

The fabrication of an integrated circuit chip is a complex process that involves multiple steps of diffusion into and deposition onto a semiconductor substrate to form multiple physical layers. Each layer of the integrated circuit chip is defined by a unique mask that is used during the fabrication process. The pattern defined by each mask is derived from the logic synthesis process described above in order to translate the layout of logic cells and filler cells defined by an integrated circuit design into physical structures at multiple layers of the semiconductor chip to implement the desired circuit functionality. Each such mask used in an integrated circuit manufacturing process is very complicated and expensive to produce.

A problem with an integrated circuit design, such as a functional problem or a circuit timing problem with a logic cell, may be discovered after integrated circuit manufacturing processes, such as mask fabrication or even semiconductor processing, have been begun, or even have been completed. The requirement for a design change late in the integrated circuit fabrication process is almost unavoidable, due to the complexity of integrated circuit designs in combination with increasingly tight time-to-market requirements for new designs. A design change to the logic cells at this point might require scrapping masks or even processed semiconductor substrates and could be very expensive. However, the availability of customizable gate array fill circuits as part of the chip design provides the circuit designer the opportunity to implement circuit modifications that may be required in a much more cost effective way. Gate array fill circuits may be configured into fully configured gate array logic elements to implement the desired functionality changes to the integrated circuit. Since the gate array logic elements may be formed from available gate array fill circuits via a backend release to the manufacturing process, such changes may be implemented with minimum disruption to an established manufacturing process. Furthermore, multiple changes to an integrated circuit design may be supported in this cost effective manner. As additional problems with an integrated circuit design may be discovered, available gate array fill circuits may be configured and reconfigured as necessary to implement the desired design changes.

Since gate array fills circuits can prove so valuable, it is desirable that the number and size of gate array fill circuits that are available to circuit designers on an integrated circuit chip be maximized. A particular challenge is to maximize the gate array fill circuits that remain available for configuration even as other gate array fill circuits are configured into gate array logic elements to implement needed circuit design changes. Maximizing gate array fill circuit density in an efficient manner is constrained by the limitations of current integrated circuit manufacturing processes and limited by currently available methods for positioning of configurable gate array fill circuits and fully configured gate array logic elements in an integrated circuit design.

Modern integrated circuit technology manufacturing constraints impose minimum distances between gate conductor layer materials and minimum distances between metal or metal-to-metal cut layer materials forming gate interconnects that may differ from one another. For purposes of enabling automated routing tools, circuit library elements are often designed to be aligned in step sizes of the metal pitch, for example, while circuit performance dictates that gate devices are placed as closely together as possible. Thus, gate array fill circuits are usually designed in multiples of the least common multiple of the placement/wiring step size and the gate layer pitch. This enables abutment of gate array fill circuits in a continuous pattern of substrate, diffusion (well), and gate devices that is advantageous both to decreasing variability in the manufacturing process and to supporting configuration of gate array logical elements that can be even larger than one individual gate array fill circuit.

Currently, the positioning of gate array logic elements in an integrated circuit design that contains previously positioned logic cells, with gate array fill circuits positioned between adjacent logic cells, may be performed either manually or with an automated placement tool. For example, a circuit designer might replace manually one or more gate array fill circuits in an integrated circuit design with one or more gate array logic elements. Of course, such a manual approach is time consuming. Furthermore, maximizing gate array fill circuit availability in the integrated circuit design with manual gate array logic element and gate array fill circuit positioning is heavily dependent upon the skill of the designer.

Current automated placement tools impose a restriction of the sites on the integrated circuit chip at which a fully configured gate array logic element might be placed to that least common multiple step size of the placement grid and the gate layer pitch. Thus, such a tool will automatically position a logic element in the integrated circuit design in alignment with a least common multiple step size grid that is defined across the entire integrated circuit design area. This approach is general, in that it enforces the same pattern across separate rows or columns of circuit placement, conducting wells, substrate areas, and the like.

BRIEF SUMMARY

An automated method and apparatus for positioning gate array fill circuits and logic elements in an integrated circuit design is disclosed. The automated method may be implemented in a data processing system. Computer program instructions for controlling a data processing system to implement the automated method may be stored in a computer readable storage medium to provide a computer program product.

An initial integrated circuit design includes logic cells and gate array fill circuits positioned therein. The gate array fill circuits are positioned in available spaces between adjacent logic cells. The logic cells are positioned in alignment with a single step size grid. The size of each gate array fill circuit is a multiple of a least common multiple step size. The gate array fill circuits are positioned between adjacent logic cells in the initial integrated circuit design in alignment both with the single step size grid and with a least common multiple step size grid. The least common multiple step size grid is defined with respect to the space between adjacent logic cells such that the least common multiple step size grid includes the maximum number of least common multiple step size grid cells that may be positioned in the space between the adjacent logic cells.

A change to the initial integrated circuit design may require that a gate array logic element be added to the design. In accordance with an illustrative embodiment, a gate array logic element to be positioned in the integrated circuit design is automatically positioned between adjacent logic cells in alignment with the least common multiple step size grid relative to the space between the adjacent logic cells. Gate array fill circuits are automatically positioned between the adjacent logic cells in alignment with the least common multiple step size grid to fill any remaining space between the adjacent logic cells that is left unoccupied by the positioned gate array logic element.

Further objects, features, and advantages will be apparent from the following detailed description and with reference to the accompanying drawings.

BRIEF DESCRIPTION OF THE SEVERAL VIEWS OF THE DRAWINGS

FIG. 7 is a flow chart of an illustrative method for positioning logic cells and a maximum number of gate array fill circuits in an integrated circuit design.

FIG. 8 is a flow chart of an illustrative method for positioning gate array logic elements and maximum gate array fill circuits in an integrated circuit design.

FIG. 9 is a flow chart of another illustrative method for positioning gate array logic elements and maximum gate array fill circuits in an integrated circuit design.

DETAILED DESCRIPTION

Figure 1:
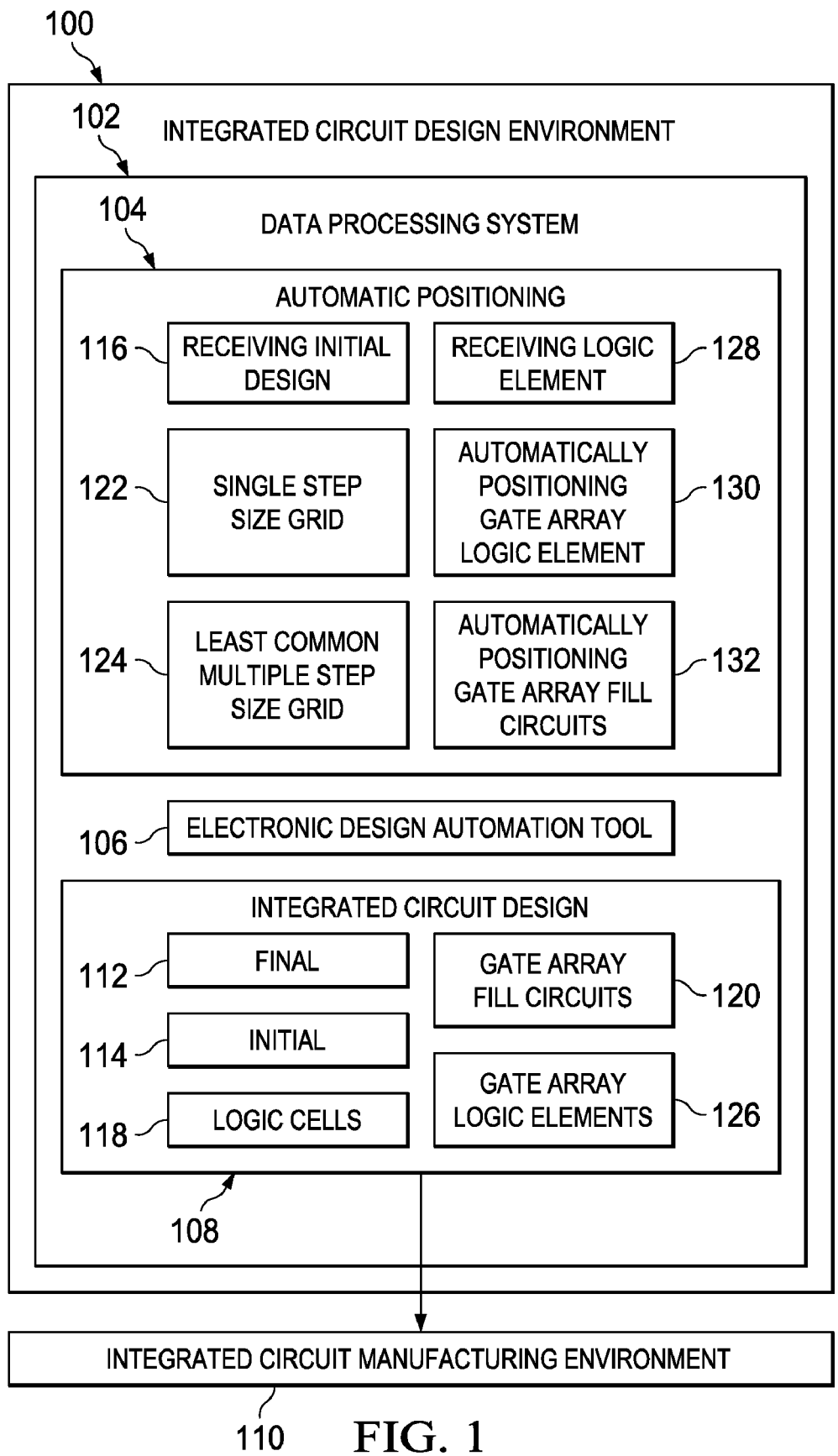
FIG. 1 is a functional block diagram of an illustrative system for the automatic positioning of gate array logic elements and gate array fill circuits in an integrated circuit design environment.

A method and apparatus by which arbitrarily positioned gate array fill circuits may be automatically replaced with fully configured gate array logic elements in an integrated circuit design process is disclosed. An illustrative integrated circuit design environment 100, in which an illustrative method and apparatus for the positioning of gate array logic elements and gate array fill circuits in an integrated circuit design may be implemented, is presented in summary in the functional block diagram of FIG. 1. Integrated circuit design environment 100 may include data processing system 102 upon which an illustrative method for the positioning of gate array logic elements and gate array fill circuits in an integrated circuit design may be implemented. As will be discussed in more detail below, data processing system 102 may include one or more general purpose or specialized computers or computer systems or other data processing systems that are operated to implement the functionality to be described. Such functionality may include automatic positioning functionality 104 and electronic design automation tool functionality 106. Automatic positioning functionality 104 and electronic design automation tool functionality 106 may be implemented in software as computer program code that is run on data processing system 102 to implement the desired functionality. Electronic design automation tool functionality 106 may include any commercially available or otherwise known electronic design automation tool that is suitable for semiconductor circuit design applications. As will be described in more detail below, automatic positioning functionality 104 may be implemented along side, in conjunction with, or as part of electronic design automation tool functionality 106, and thus operate in cooperation with electronic design automation tool functionality 106, or may be implemented and operated separately from electronic design automation tool functionality 106.

In an illustrative embodiment, automatic positioning 104 and electronic design automation tool functionality 106 operate to produce an integrated circuit design 108. Integrated circuit design 108 may be stored as one or more data structures, in any desired form, in data processing system 102. Integrated circuit design 108 may be provided to integrated circuit manufacturing environment 110, such as an automated integrated circuit manufacturing environment, for use by integrated circuit manufacturing environment 110 for the fabrication of integrated circuits corresponding to the integrated circuit design 108. Integrated circuit design 108 may be provided to integrated circuit manufacturing environment 110 in any form and manner as may be required or desired by integrated circuit manufacturing environment 110.

In accordance with an illustrative embodiment, automatic positioning 104 is used to provide final 112 integrated circuit design 108 based on initial 114 integrated circuit design 108. Thus, automatic positioning 104 is adapted for receiving 116 initial 114 integrated circuit design 108.

Initial 114 integrated circuit design 108 includes logic cells 118 and gate array fill circuits 120 positioned thereon. Logic cells 118 may be positioned in integrated circuit design 108 using electronic design automation tool functionality 106, and are not moved in position by automatic positioning 104. In accordance with an illustrative embodiment, logic cells 118 and gate array fill circuits 120 are positioned in integrated circuit design 108 on single step size grid 122 that defines where devices may be positioned in integrated circuit design 108. The single step size is defined based on physical parameters of the integrated circuit manufacturing process to be used to make integrated circuits based on integrated circuit design 108. Single step size grid 122 is defined across the entire area of the integrated circuit design 108.

Gate array fill circuits 120 are positioned in spaces between adjacent logic cells 118 positioned in the integrated circuit design 108. In accordance with an illustrative embodiment, in the initial 114 integrated circuit design 108 gate array fill circuits 120 are positioned between adjacent logic cells 118 so as to maximize the gate array fill circuits 120 positioned between adjacent logic cells 118. This may be accomplished by positioning gate array fill circuits 120 between adjacent logic cells 118 in alignment with the single step size grid 122 beginning with a cell of the single step size grid 122 immediately adjacent to a logic cell 118 and filling the space between adjacent logic cells 118 with gate array fill circuits 120 from this point. Alternatively, filling the space between adjacent logic cells 118 with gate array fill circuits 120 may begin with a cell of the single step size grid 122 that is offset from a logic cell 118 but that still allows maximum filling of the space between adjacent logic cells 118 with gate array fill circuits 120.

The size of each gate array fill circuit 120 in the integrated circuit design 108 is a multiple of a least common multiple step size. This size limitation of gate array fill circuits 120 also is defined by physical parameters of the integrated circuit manufacturing process to be used to make integrated circuits based on the integrated circuit design 108. The positions of gate array fill circuits 120 positioned between logic cells 118 in the integrated circuit design 108 thus define least common multiple step size grids 124 in all of the spaces between adjacent logic cells 118 that contain gate array fill circuits 120. Least common multiple step size grids 124 are in alignment with single step size grid 122, but are defined locally based on the maximum filling of the space between adjacent logic cells 118 with gate array fill circuits 120.

Gate array logic elements 126, also known as configured or fully configured logic elements, are derived from configurable gate array fill circuits 120 positioned in the integrated circuit design 108. The need to position one or more gate array logic elements 126 in the integrated circuit design 108 may arise, for example, from the need to provide functionality to correct a problem detected in the initial 114 integrated circuit design 108. In accordance with an illustrative embodiment, automatic positioning 104 is used to position one or more gate array logic elements 126 that are to be added to an initial 114 integrated circuit design 108. Thus, logic elements 126 to be positioned in the integrated circuit design 108 are received 128 by automatic positioning function 104 along with the initial 114 integrated circuit design 108 into which the gate array logic elements 126 are to be positioned.

In accordance with an illustrative embodiment, automatic positioning 104 includes automatically positioning gate array logic elements 130 in integrated circuit design 108 in spaces between adjacent logic cells 118 and in alignment with least common multiple step size grid 124 defined between adjacent logic cells 118. Automatic positioning 104 also includes automatically positioning gate array fill circuits 132 in alignment with least common multiple step size grid 124 in any spaces remaining between adjacent logic cells 118 that are not filled by positioned gate array logic elements 126. Such automatic positioning 104 may be performed in cooperation with and/or using positioning functions provided by electronic design automation tool functionality 106. Such automatic positioning 104 results in final 112 integrated circuit design 108 having logic cells 118, gate array fill circuits 120, and gate array logic elements 126 positioned thereon automatically so as to maximize available gate array fill circuits 120. Final 112 integrated circuit design 108 may be provided for use by integrated circuit manufacturing environment 110, as described above.

The illustration of FIG. 1 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments. For example, as discussed above, automatic positioning 104 may be implemented as part of electronic design automation tool functionality 106, may make use of functions provided by electronic design automation tool functionality 106 to implement one or more functions of automatic positioning 104, or may be operated independently of electronic design automation tool functionality 106.

It should also be noted that single step size grid 122 and least common multiple step size grid 124 are concepts presented herein in order to facilitate describing the positioning of various components in an integrated circuit design 108. Single step size grid 122 and/or least common multiple step size grid 124 may not need to be implemented as functions or used for component positioning in order to achieve the positioning described and claimed using these terms. Furthermore, initial 114 and final 112 do not refer to structures of an integrated circuit design 108, but are used to refer to different states of an integrated circuit design 108, or different integrated circuit designs 108, at different points in time with respect to automatic positioning process 104.

Figure 2:
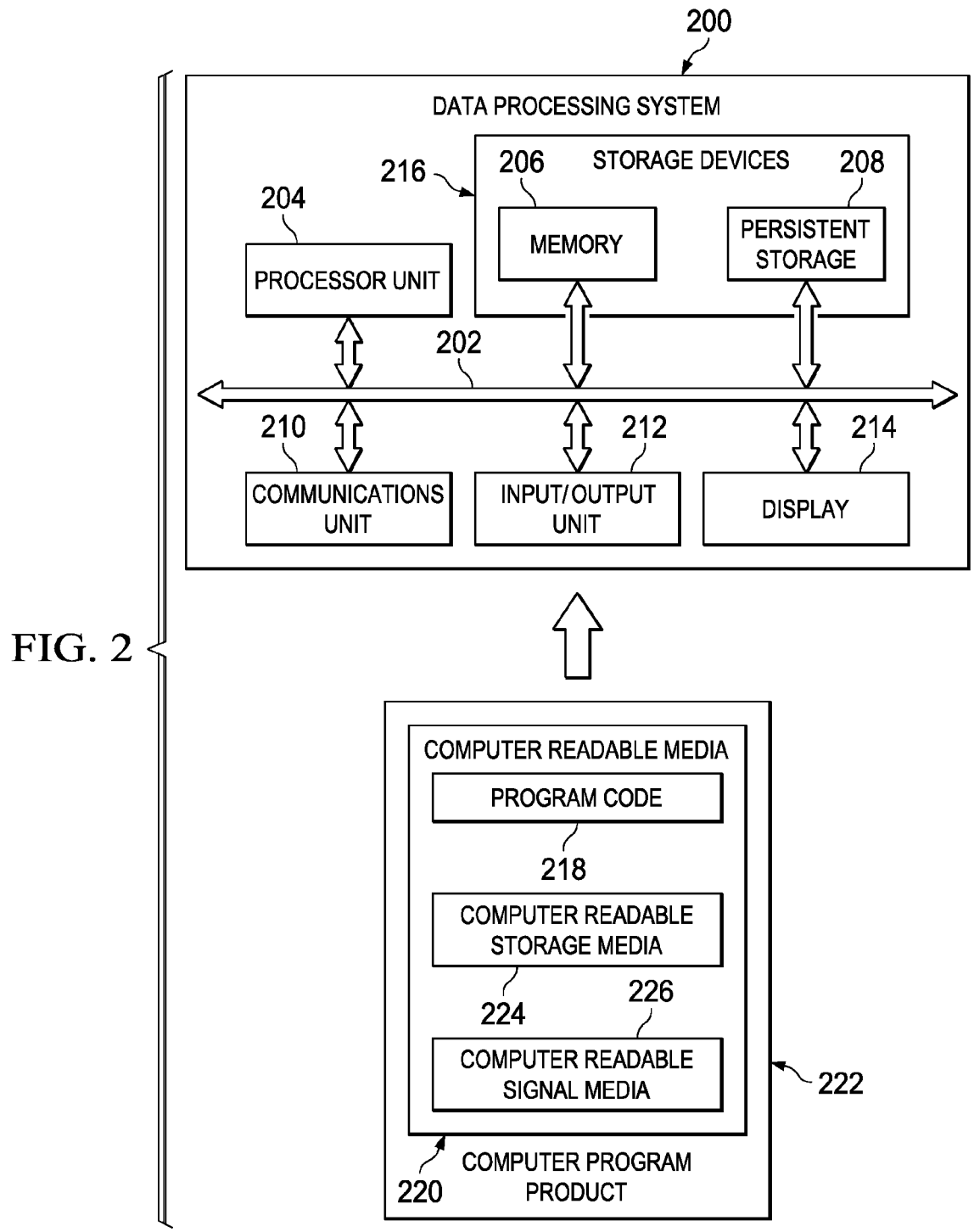
FIG. 2 is a block diagram of a data processing system depicted in accordance with an illustrative embodiment.

Turning now to FIG. 2, a diagram of a data processing system 200 is depicted in accordance with an illustrative embodiment. In this example, data processing system 200 is an example of one implementation of data processing system 102 in FIG. 1. In this illustrative example, data processing system 200 includes communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a set of one or more processors or may be a multi-processor core, depending on the particular implementation. Further, processor unit 204 may be implemented using one or more heterogeneous processor systems, in which a main processor is present with secondary processors on a single chip. As another illustrative example, processor unit 204 may be a symmetric multi-processor system containing multiple processors of the same type.

Memory 206 and persistent storage 208 are examples of storage devices 216. A storage device is any piece of hardware that is capable of storing information, such as, for example, without limitation, data, program code in functional form, and/or other suitable information either on a temporary basis and/or a permanent basis. Memory 206, in these examples, may be, for example, a random access memory, or any other suitable volatile or non-volatile storage device. Persistent storage 208 may take various forms, depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 may be removable. For example, a removable hard drive may be used for persistent storage 208.

Communications unit 210, in these examples, provides for communication with other data processing systems or devices. In these examples, communications unit 210 is a network interface card. Communications unit 210 may provide communications through the use of either or both physical and wireless communications links.

Input/output unit 212 allows for the input and output of data with other devices that may be connected to data processing system 200. For example, input/output unit 212 may provide a connection for user input through a keyboard, a mouse, and/or some other suitable input device. Further, input/output unit 212 may send output to a printer. Display 214 provides a mechanism to display information to a user.

Instructions for the operating system, applications, and/or programs may be located in storage devices 216, which are in communication with processor unit 204 through communications fabric 202. In these illustrative examples, the instructions are in a functional form on persistent storage 208. These instructions may be loaded into memory 206 in order to be run by processor unit 204. The processes of the different embodiments may be performed by processor unit 204 using computer implemented instructions, which may be located in a memory, such as memory 206.

These instructions are referred to as program code, computer usable program code, or computer readable program code that may be read and run by a processor in processor unit 204. The program code, in the different embodiments, may be embodied on different physical or computer readable storage media, such as memory 206 or persistent storage 208.

Program code 218 is located in a functional form on computer readable media 220 that is selectively removable and may be loaded onto or transferred to data processing system 200 to be run by processor unit 204. Program code 218 and computer readable media 220 form computer program product 222. In one example, computer readable media 220 may be computer readable storage media 224 or computer readable signal media 226. Computer readable storage media 224 may include, for example, an optical or magnetic disc that is inserted or placed into a drive or other device that is part of persistent storage 208 for transfer onto a storage device, such as a hard drive, that is part of persistent storage 208. Computer readable storage media 224 also may take the form of a persistent storage, such as a hard drive, a thumb drive, or a flash memory that is connected to data processing system 200. In some instances, computer readable storage media 224 may not be removable from data processing system 200.

Alternatively, program code 218 may be transferred to data processing system 200 using computer readable signal media 226. Computer readable signal media 226 may be, for example, a propagated data signal containing program code 218. For example, computer readable signal media 226 may be an electro-magnetic signal, an optical signal, and/or any other suitable type of signal. These signals may be transmitted over communications links, such as wireless communications links, an optical fiber cable, a coaxial cable, a wire, and/or any other suitable type of communications link. In other words, the communications link and/or the connection may be physical or wireless in the illustrative examples.

In some illustrative embodiments, program code 218 may be downloaded over a network to persistent storage 208 from another device or data processing system through computer readable signal media 226 for use within data processing system 200. For instance, program code stored in a computer readable storage media in a server data processing system may be downloaded over a network from the server to data processing system 200. The data processing system providing program code 218 may be a server computer, a client computer, or some other device capable of storing and transmitting program code 218.

The different components illustrated for data processing system 200 are not meant to provide architectural limitations to the manner in which different embodiments may be implemented. The different illustrative embodiments may be implemented in a data processing system including components in addition to or in place of those illustrated for data processing system 200. Other components shown in FIG. 2 can be varied from the illustrative examples shown. The different embodiments may be implemented using any hardware device or system capable of executing program code. As one example, data processing system 200 may include organic components integrated with inorganic components and/or may be comprised entirely of organic components excluding a human being. For example, a storage device may be comprised of an organic semiconductor.

As another example, a storage device in data processing system 200 is any hardware apparatus that may store data. Memory 206, persistent storage 208, and computer readable media 220 are examples of storage devices in a tangible form.

In another example, a bus system may be used to implement communications fabric 202 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, memory 206 or a cache such as found in an interface and memory controller hub that may be present in communications fabric 202.

An illustrative embodiment of a method for positioning gate array logic elements and gate array fill circuits in an integrated circuit design is described and explained in more detail with reference to the series of FIGS. 3-6 which illustrate in representational form a portion of a column 300 of an integrated circuit design. The illustrations of FIGS. 3-6 are presented for purposes of explaining by example the illustrative embodiment and are not intended to illustrate accurately any actual integrated circuit design or portion thereof. Furthermore, although an exemplary column 300 of an integrated circuit design is illustrated in these figures, it should be understood that the illustrative embodiment is not limited in any way to integrated circuit designs having components positioned along columns. The illustrative embodiment would apply equally to integrated circuit designs having components positioned along rows, and, for purposes of the illustrative embodiments described herein, the terms rows and columns when used to refer to an integrated circuit design may be used interchangeably. The illustrative embodiments described herein may be applied to any other one or two dimensional scheme for positioning components of an integrated circuit design, with appropriate modification as may be necessary and known to those having skill in the art.

Figure 3:
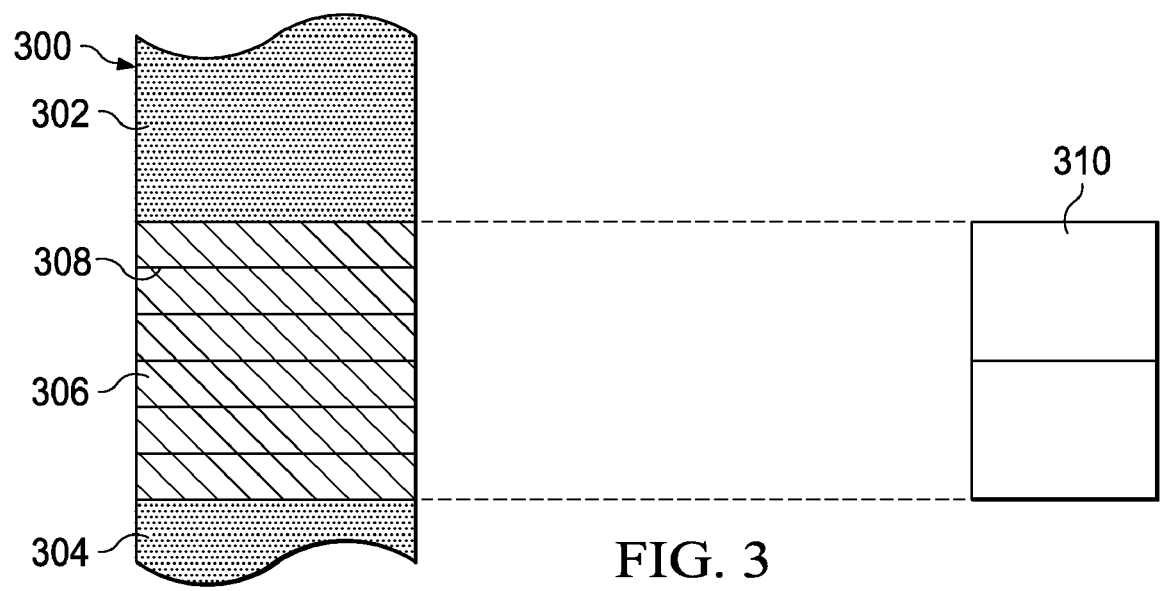
FIG. 3 is a representational illustration of a portion of an integrated circuit column, showing the placement of adjacent logic cells thereon with gate array fill circuits filling the space between the adjacent logic cells.

Turning first to FIG. 3, an illustrative method for positioning gate array logic elements and gate array fill circuits begins with an initial integrated circuit design in which logic cells 302 and 304 are positioned in the integrated circuit design at adjacent positions along column 300. As will be discussed in more detail below, logic cells 302 and 304 may be positioned in the integrated circuit design as the result of a standard logic synthesis operation that is facilitated by any commercially available electronic design automation tool. Logic cells 302 and 304, which may also be known as standard logic cells, are adjacent but separated by "white space". In accordance with the illustrative embodiment, this empty white space between adjacent logic cells 302 and 304 is filled initially with gate array fill circuits 306, indicated by the angled lines in FIG. 3.

As discussed above, manufacturing and design considerations dictate that components may not be positioned just anywhere on a semiconductor chip. Rather, such component placement must conform to spacing and alignment requirements that facilitate effective circuit design and maximize component density while preventing unintended interaction between adjacent components. This positioning requirement for all components is defined in terms of a single step size grid. The single step size grid is defined over the entire area of the integrated circuit to be formed. The single step size grid is formed of cells which extend along the integrated circuit columns or rows a distance defined by the single step size and which are aligned across columns or rows to form the grid. The single step size may be, for example, related to the minimum size of a metal track connector structure used in the particular integrated circuit manufacturing process involved. Alternatively, the single step size may be based on one or more other or additional manufacturing or design considerations. In FIGS. 3-6, a portion of single step size grid 308 that applies to column 300 is shown by horizontal line segments.

In accordance with the illustrative embodiment, logic cells 302 and 304 and gate array fill circuits 306 are positioned in the integrated circuit design in alignment with single step size grid 308. In order to maximize gate array fill circuits 306 positioned between adjacent logic cells 302 and 304, gate array fill circuits 306 are positioned immediately adjacent to each other in alignment with single step size grid 308. Gate array fill circuits 306 may be positioned starting with a cell of single step size grid 308 that is immediately adjacent to at least one of adjacent logic cells 302 or 304. Thus, gate array fill circuits 306 may be positioned immediately adjacent to, or abutting, at least one of adjacent logic cells 302 or 304. Alternatively, depending on the size of the space between adjacent logic cells 302 and 304, it may also be possible to offset gate array fill circuits 306 from both adjacent logic cells 302 and 304 while still maximizing gate array fill circuit density between logic cells 302 and 304.

Manufacturing and design considerations also define a size of gate array fill circuits 306 that may be formed as part of an integrated circuit in terms of a least common multiple step size. Gate array fill circuits 306 may be formed to any size along column 300 that is a multiple of the least common multiple step size. In other words, the smallest gate array fill circuit 306 that can be positioned in column 300 would take up one least common multiple step size. For purposes of illustration going forward, we will define the least common multiple step size to be equal to three times the single step size. It should be understood, however, that the least common multiple step size may be defined in terms of any multiple of the single step size, depending upon the integrated circuit technology involved.

Since gate array fill circuits 306 must conform to a multiple of the least common multiple step size, gate array fill circuits 306 positioned between adjacent logic cells 302 and 304 may be used to define least common multiple step size grid 310 with respect to the space between adjacent logic cells 302 and 304. This least common multiple step size grid 310 is illustrated next to integrated circuit column 300 in FIGS. 3-6 for ease of reference. Since least common multiple step size grid 310 is defined based on the least common multiple step size and maximum filling of the space between adjacent logic cells 302 and 304 with gate array fill circuits 306, which is accomplished with reference to the white space between adjacent logic cells 302 and 304, it has several notable characteristics. Each cell of least common multiple step size grid 310 is a multiple of the single step size. In this exemplary case, each cell of least common multiple step size grid 310 is three times the single step size. Least common multiple step size grid 310 is aligned with single step size grid 308 and may be, but need not be, immediately adjacent to at least one of adjacent logic cells 302 and 304. In any case, lest common multiple step size grid 310 includes the maximum number of least common multiple step size grid cells that may be positioned in the space between logic cells 302 and 304. Gate array fill circuits 306 are aligned with both single step size grid 308 and least common multiple step size grid 310. Finally, whereas single step size grid 308 is defined uniformly across the integrated circuit design, least common multiple step size grid 310 is defined with respect to the space between individual adjacent logic cells 302 and 304. Since logic cells 302 and 304 are positioned randomly with respect to single step size grid 308, least common multiple step size grids defined between other adjacent logic cells in column 300, or in other columns of the integrated circuit design, may or may not be in alignment with least common multiple step size grid 310 or with each other. However, all least common multiple step size grids in the integrated circuit design will be in alignment with the universal single step size grid 308.

Figure 4:
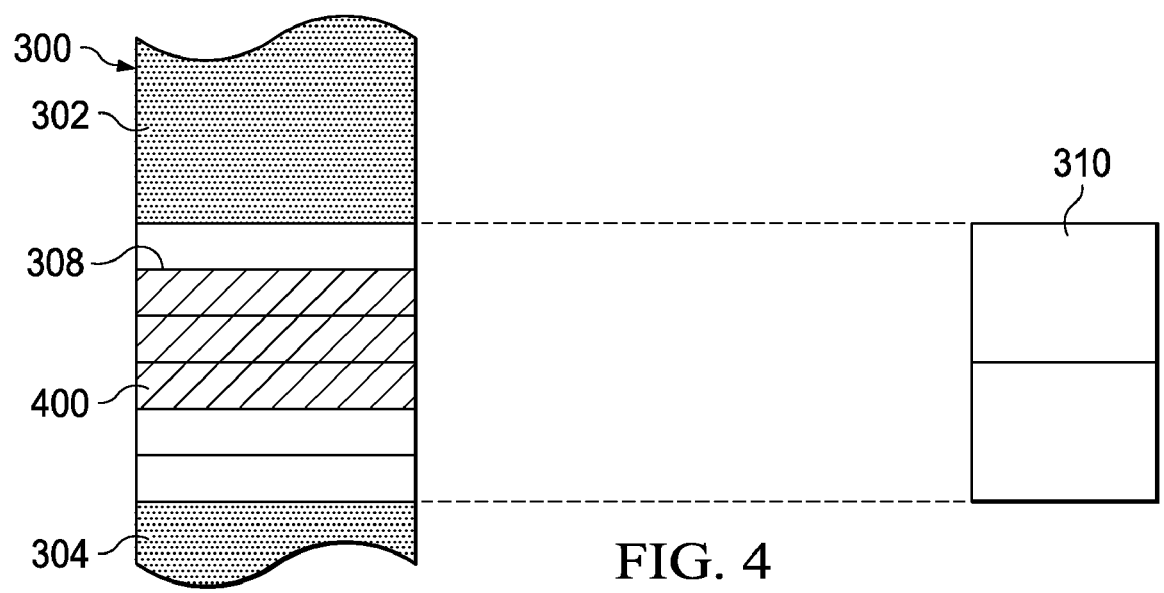
FIG. 4 is a representational illustration of the portion of an integrated circuit column shown in FIG. 3, showing a gate array logic element as initially positioned in the space between the adjacent logic cells.

Turning now to FIG. 4, an engineering design change, such as may be required to correct a functional defect in the original integrated circuit design, may call for the placement of gate array logic element 400 in the integrated circuit design. Gate array logic element 400, which also may be referred to as a configured or fully configured logic element, is formed by configuration of available configurable gate array fill circuits 306 in the integrated circuit design. Thus, gate array logic element 400 may be positioned anywhere in the integrated circuit design where gate array fill circuits 306 of sufficient size are available. In accordance with an illustrative embodiment, gate array logic element 400 may be positioned initially in the integrated circuit design using a commercially available electronic design automation tool based on one or more circuit design considerations that are typically considered in the placement of logic elements in an integrated circuit design. For example, such design considerations may include circuit timing conditions and/or one or more other conditions that may cause gate array logic element 400 to be positioned initially physically close to a circuit structure which gate array logic element 400 is to modify or correct.

An exemplary initial placement position for gate array logic element 400 in column 300 is illustrated in FIG. 4. As can be seen, gate array logic element 400 takes up three single step size spaces between logic cells 302 and 304 and is aligned with single step size grid 308. However, the initial placement position of logic element 400 is not in alignment with least common multiple step size grid 310. There are three single step size spaces remaining between adjacent logic cells 302 and 304 and gate array logic element 400, but due to the initial placement position of gate array logic element 400 these three single step size spaces are not immediately adjacent. Since, in our example, a gate array fill circuit requires three adjacent single step size spaces, the initial placement position of gate array logic element 400 between adjacent logic cells 302 and 304 prevents a gate array fill circuit from being positioned in this space. Thus, the three single step size spaces remaining between adjacent logic cells 302 and 304 and gate array logic element 400 are essentially wasted.

An initial placement position for logic element 400 such as that illustrated in FIG. 4 is likely to occur when current automated placement tools are used to position logic elements in the integrated circuit design, and illustrate a limitation of such current automated placement tools. As discussed above, current automated placement tools impose a restriction of the sites on the integrated circuit chip at which a fully configured logic element might be placed to a least common multiple step size of the placement grid and the gate layer pitch. Thus, such a tool will automatically position a logic element in the integrated circuit design in alignment with a least common multiple step size grid that is defined across the entire integrated circuit design area. This approach is general, in that it enforces the same pattern across separate rows or columns of circuit placement, conducting wells, substrate areas, and the like. However, it achieves such generality at the expense of circuit density. For example, if the gate layer and placement grid align only every three placement and/or metal layer steps, and the smallest gate array circuits, and, therefore, logic elements, are three step sizes, then such circuits will not be fit by the conventional placement tool into any arbitrary three step size space between other circuit elements that are placed randomly with respect to a single step size grid, but only into such spaces that happen to align with the least common multiple step size grid. This problem is solved in accordance with the illustrative embodiment by use of a least common multiple step size grid that is defined not across the entire integrated circuit design but with respect to the space between the randomly placed logic cell circuit elements themselves.

Figure 5:
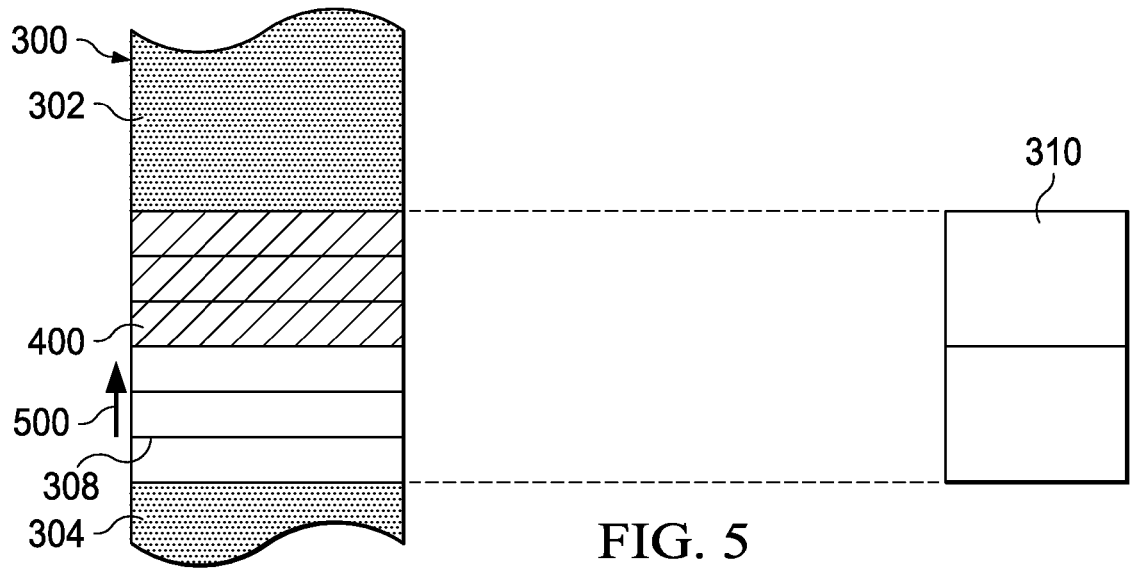
FIG. 5 is a representational illustration of the portion of an integrated circuit column shown in FIG. 4, showing the gate array logic element repositioned from the initial position to a position providing for maximum post-filling of the remaining space between the logic cells with gate array fill circuits.

Turning now to FIG. 5, in accordance with an illustrative embodiment, the position of gate array logic element 400 having an initial placement position that is not in alignment with least common multiple step size grid 310 is adjusted to a position that is in alignment with least common multiple step size grid 310. Preferably, the position of gate array logic element 400 may be adjusted by the minimum number of single step sizes necessary to align gate array logic element 400 with least common multiple step size grid 310. This will minimize the effect of the change in position on the timing or other circuit design considerations used in determining the initial placement position of gate array logic element 400. In this case, the position of gate array logic element 400 is adjusted from its initial placement position by one single step size in the direction indicated by arrow 500.

For any given configured gate array logic element, or set of elements, it is shown that a move of at most floor (least common multiple step size/2) single step sizes in one direction or the other is required. If the gate array least common multiple step size were three, for example, then alignment of any arbitrarily placed gate array logic element with the gate array step relative to the origins of the originally placed gate array fill circuits, i.e., in alignment with a least common multiple step size grid as defined herein, is achieved by a move of one, or floor(3/2)=floor(1.5)=1, single step size in either placement direction along the circuit column or row. If the gate array least common multiple step size were seven single step sizes, up to three single step sizes of movement in one direction or the other would be required for an alignment.

Figure 6:
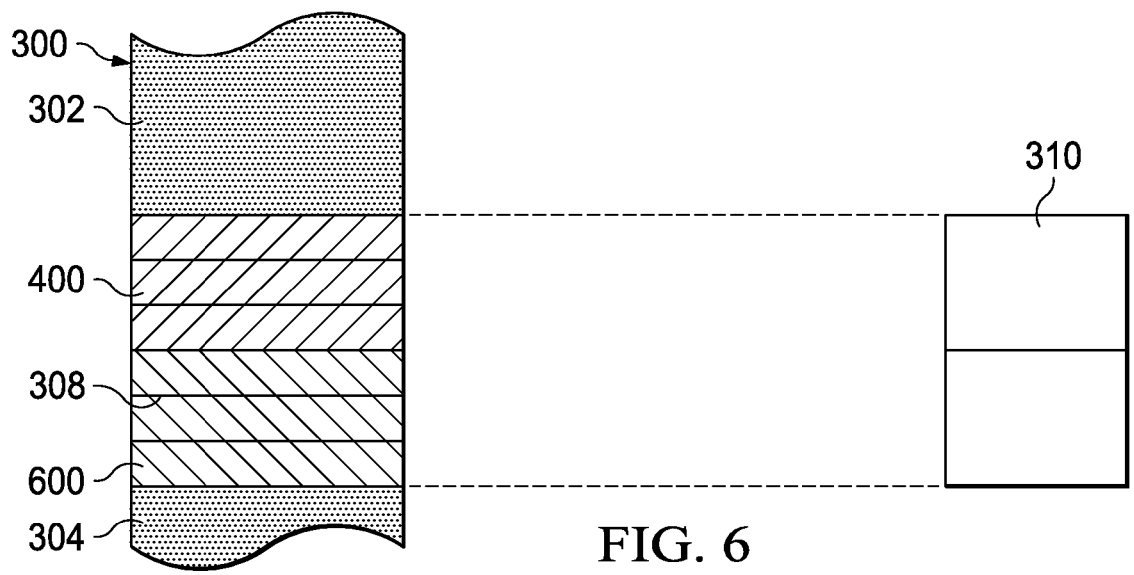
FIG. 6 is a representational illustration of the portion of an integrated circuit column shown in FIG. 5, showing the remaining space between the adjacent logic cells filled with gate array fill circuits.

Turning now to FIG. 6, any space remaining between adjacent logic cells 302 and 304 that is not filled by gate array logic element 400 and that is large enough to accommodate a gate array fill circuit is filled with gate array fill circuits 600. Alignment of gate array logic element 400 with least common multiple step size grid 310 maximizes the space remaining between adjacent logic elements 302 and 304 that may be filled with gate array fill circuits 600. Given such alignment of gate array logic element 400, any remaining white space is guaranteed to be fillable by gate array fill circuits 600 in multiples of the least common multiple step size, since this area between adjacent logic cells 302 and 304 accommodated gate array fill circuits 306 (see FIG. 3) before the gate array logic element 400 required by an engineering change was added. Since only gate array fill circuits are removed or remapped, alignment with the gate array least common multiple step size grid 310 guarantees the remaining space can accommodate a full population of gate array circuits. This can be accomplished by any of a number of conventional fill placement techniques, such as stepping circuit columns or rows and testing the validity of placing gate array fill circuits from largest size to smallest, or mapping the white space and filling it with such circuits in intelligent combinations or not. Such placement techniques should ensure that the newly placed gate array fill circuits abut already placed circuits, so that no spaces are left behind that are less than the least common multiple step size. This is accomplished by making sure that the gate array fill circuits 600 that are positioned to fill the space are aligned with the least common multiple step size grid 310. Note that spaces smaller than the least common multiple step size, if they exist after initial placement of gate array logic cells 400 or full population of gate array fill circuits 600, are assumed to be marked as containing a logic cell, such as of one or two single step sizes in the current example, whether or not a cell physically resides there, and only gate array circuits are manipulated during such engineering changes.

As discussed above, a method in accordance with an illustrative embodiment for automatic positioning of gate array logic elements and gate array fill circuits in an integrated circuit design begins with an initial integrated circuit design, such as that illustrated in FIG. 3, in which logic cells 302 and 304 have been positioned and the space between adjacent logic cells has been filled with the maximum gate array fill circuits 306. An exemplary method 700 for creating such an initial integrated design is illustrated in the flow chart diagram of FIG. 7.

Beginning with a blank slate, but subject to placement criteria as described above and represented in the form of single step size placement grid 308, logic cells 302 and 304 are positioned in the integrated circuit design (step 702). Logic cells 302 and 304 are randomly positioned in the integrated circuit design in alignment with single step size grid 308. Step 702 may be performed in a conventional manner as part of a standard logic synthesis operation that is facilitated by any commercially available electronic design automation tool, such as electronic design automation tool functionality 106 of FIG. 1.

Any space remaining between adjacent positioned logic cells 302 and 304 is post filled with the maximum gate array fill circuits 306 (step 704). This may be accomplished by positioning gate array fill circuits 306 in the space between adjacent logic cells 302 and 304 in alignment with single step size grid 308 starting in a position immediately adjacent to at least one of the adjacent logic cells 302 and 304.

Maximum filling of the space between adjacent logic cell 302 and 304 with gate array fill circuits 306 does not necessarily require starting the fill immediately adjacent to one of the logic cells 302 and 304. Filling with maximum gate array fill circuits 306 may begin at an offset from adjacent logic cells 302 and 304, if desired, if allowed by the distance between adjacent logic cells 302 and 304. For example, if the least common multiple step size is three single step sizes and the white space between two logic cells 302 and 304 is 3N+2 single step sizes, then gate array fill circuits 306, and thus the least common multiple step size grid 310, could begin at a one single step size offset from both adjacent logic cells 302 and 304 without loss of generality or gate array fill circuit density. Likewise, if the least common multiple step size is seven single step sizes, depending on the amount of white space between adjacent logic cells 302 and 304, the offset could be one, where the white space is 7N+2 or 7N+3 single step sizes, two, where the white space is 7N+4 or 7N+5 single step sizes, or even three, where the white space is 7N+6, single step sizes without loss of density.

An exemplary method 800 in accordance with an illustrative embodiment for positioning gate array logic elements and gate array fill circuits in an initial integrated circuit design created by the process of FIG. 7 is illustrated in the flow chart diagram of FIG. 8.

Process 800 may begin with receiving one or more logic elements 400 to be positioned in the integrated circuit design (step 802). As discussed above, with reference to FIG. 4, gate array logic element 400 may be required to be added to the integrated circuit design as the result of an engineering change to correct a problem in the initial integrated circuit design. Gate array logic element 400 is formed by configuring one or more of configurable gate array fill circuits 306.

The initial gate array circuit post fill is removed from the initial design (step 804) and the single step size grid is set (step 806) for initial placement of gate array logic element 400 in the integrated circuit design. The effect of steps 804 and 806 is to allow an automatic placement step to follow to position gate array logic element 400 in any space of sufficient size between adjacent logic elements 302 and 304, subject to alignment of the initial placement position of gate array logic element 400 with single step size grid 308.

Gate array logic element 400 is automatically positioned in an initial placement position in the integrated circuit design (step 808). The initial placement position will be between adjacent logic cells 302 and 304 and in alignment with single step size grid 308. Step 808 may be performed using a commercially available electronic design automation tool, such as electronic design automation tool functionality 106 of FIG. 1. Such an electronic design automation tool may determine the initial placement position of gate array logic element 400 based on one or more circuit design considerations, such as circuit timing considerations. The exemplary integrated circuit design after step 808 in the process 800 being described is illustrated in FIG. 4.

Least common multiple step size grid 310 is set relative to the space between adjacent logic cells 302 and 304 (step 810). As discussed above, least common multiple step size grid 310 may be defined with reference to the gate array fill circuits 306 that initially fill the space between adjacent logic cells 302 and 304. Thus, least common multiple step size grid 310 is aligned with single step size grid 308 and may or may not be immediately adjacent to at least one of adjacent logic cells 302 and 304, but includes the maximum number of least common multiple step size grid cells that may be positioned in the space between adjacent logics 302 and 304.

If the initial placement position of gate array logic element 400 is not in alignment with least common multiple step size grid 310, the position of gate array logic element 400 is adjusted from the initial placement position to align the position of gate array logic element 400 with least common multiple step size grid 310 (step 812). As discussed above, with reference to FIG. 5, step 812 preferably is accomplished by moving gate array logic element 400 from the initial placement position by the minimum number of single step sizes required to move gate array logic element 400 into alignment with least common multiple step size grid 310.

The placement process is set back to reference single step size grid 308 (step 814) and the remaining space between adjacent logic cells 302 and 304 is filled with gate array fill circuits 600 in alignment with single step size grid 308 (step 816). Alignment of gate array logic element 400 with least common multiple step size grid 310 in step 812 ensures that gate array fill circuits 600 also will be aligned with least common multiple step size grid 310 and that any space remaining between logic cells 302 and 304 that is not occupied by gate array logic element 400 will be filled up entirely with gate array fill circuits 600, like a brick wall. Step 816 may be accomplished by any of a number of conventional fill placement techniques, such as stepping circuit columns or rows and testing the validity of placing gate array fill circuits from largest size to smallest, or mapping the white space and filling it with such circuits in intelligent combinations or not. Such placement techniques should ensure that the newly placed gate array fill circuits abut already placed circuits, so that no spaces are left behind that are less than the least common multiple step size. This is accomplished by making sure that gate array fill circuits 600 that are positioned to fill the space are aligned with least common multiple step size grid 310. The exemplary integrated circuit design after this step 816 in the process 800 being described is illustrated in FIG. 6.

Least common multiple step size grid 310 may be set again for the placement process 800 (step 818). Step 818 is optional.

An exemplary method 900 in accordance with another illustrative embodiment for positioning logic elements and gate array circuits in an initial integrated circuit design created by the process of FIG. 7 is illustrated in the flow chart diagram of FIG. 9.

Process 900 may begin with receiving one or more logic elements 400 to be positioned in the integrated circuit design (step 902). As discussed above, with reference to FIG. 4, gate array logic element 400 may be required to be added to the integrated circuit design as the result of an engineering change to correct a problem in the initial integrated circuit design. Gate array logic element 400 is formed by configuring one or more of configurable gate array fill circuits 306.

Gate array logic element 400 is automatically mapped to one or more contiguous post filled gate array fill circuits 306 comprising the same space requirement as gate array logic element 400 (step 904). In this case, gate array logic element 400 may not be positioned in any space of sufficient size between logic cells 302 and 304, but must be positioned in a space of the same size as the gate array logic element that is already occupied by gate array fill circuit 306. Many such spaces may be found throughout the initial integrated circuit design, and step 904 may determine the initial placement position of gate array logic element 400 from among available positions based on one or more circuit design considerations, such as circuit timing considerations.

For purposes of the present example, assume that gate array fill circuits 306 of FIG. 3 include two gate array fill circuits, each of which is three single step sizes in size. One of gate array fill circuits 306 is adjacent to logic cell 302 and the other is adjacent to logic cell 304. Gate array logic element 400 is three single step sizes in size. Therefore, step 904 may map logic element 400 to one of gate array fill circuits 306, for example to gate array fill circuit 306 that is adjacent to logic cell 302.

Selected gate array fill circuits 306 to which gate array logic element 400 is mapped are removed (step 906) and logic element 400 is positioned in the mapped area (step 908) in place of the removed gate array fill circuits 306. The remaining gate array fill circuits 600 filling the space between adjacent logic elements 302 and 304 that are not occupied by the gate array logic element 400 are kept in place. The exemplary integrated circuit design after this step 908 in the process 900 being described is illustrated in FIG. 6.

It can be seen that the results of exemplary methods 800 and 900 in terms of gate array circuit density may be the same. In method 900 only one gate array fill circuit of exact size is removed for each gate array logic element to be placed. In such a case movement of a logic element from an initial placement position to an adjusted position is not required. Maximum gate array fill circuit density is maintained from the original post fill of gate array fill circuits. Method 900 however may place undesired limitations on gate array logic element placement and may not be supported as well as method 800 by current commercially available electronic design automation tools to assist with gate array logic element placement. In method 800, all gate array fill circuits are removed from the initial design and large contiguous white spaces are left between logic cells after gate array logic element placement. In this case, determining the adjustment required to move a gate array logic element from an initial placement position is based on the offset of the placement origin relative to the end of the white space in which the configured gate array logic element is placed, in our exemplary case, a multiple of three single step sizes from the nearest placed logic cell circuit element. Note that implementation of such a position adjustment step is not constrained to any particular parallel or sequential processing of element placement or the use of previously processed elements in guiding the future processing of other configured logic elements. Anyone skilled in the art could affect such a change in implementation.

The illustrated embodiments therefore provide a method and apparatus by which gate array fill circuits and fully configured gate array logic elements may be placed automatically to guarantee "front end of line" alignment at arbitrary placement steps to premanufactured masks for integrated circuit fabrication. Given the placement of cells that includes the gate array fill circuits originally presented for mask manufacture, all gate array fill circuits are removed from the design. Gate array logic elements are initially positioned, using an automated placement tool, and a secondary process is employed to adjust the position of the placed fully configured gate array logic elements such that their origins align with a mapping of the origins of the originally placed gate array fill circuit elements, within a least common multiple placement step. Alternatively, only those gate array fill circuits that map to the optimal placement of the fully configured gate array logic element are removed for replacement. Automatic placement of fully configured gate array logic elements in accordance with the illustrative embodiments prevents misalignment of the configured elements from the masks generated for the original filler cells.

The illustrative embodiments therefore provide a method and apparatus for the positioning of gate array logic elements and gate array fill circuits in an integrated circuit design that improves available logic cell density. The illustrative embodiments are different from what has been done previously because the least common multiple filler placement channel step limitation of previous methods of gate array logic element placement is relieved to improve gate array positioning and density by constraining placement of fully configured gate array logic elements on an implicit channel step relative to the beginning of the area of "whitespace" into which the element is placed. The automated placement technique of the illustrative embodiments guarantees that fully configured gate array logic elements placed in an integrated circuit design align with arbitrarily placed configurable gate array fill circuits from which the gate array logic elements will be derived. This is accomplished by alignment to the origins of such original gate array fill circuits or to a multiple of a least common multiple step relative to the origins of such original fill circuits. The illustrative embodiments provide an automated methodology for implementing such a placement technique. The illustrative embodiments may make use of a general purpose circuit element placement tool but employ additional processing steps that may or may not be implemented as part of the placement tool.

It should be understood that methods and apparatus for automatic gate array positioning in accordance with the illustrative embodiments may be applied to the automatic positioning of application-specific integrated circuit (ASIC) type circuits and may be extended also to "sea of gates" or field programmable gate array (FPGA) type designs.

Figure 10:
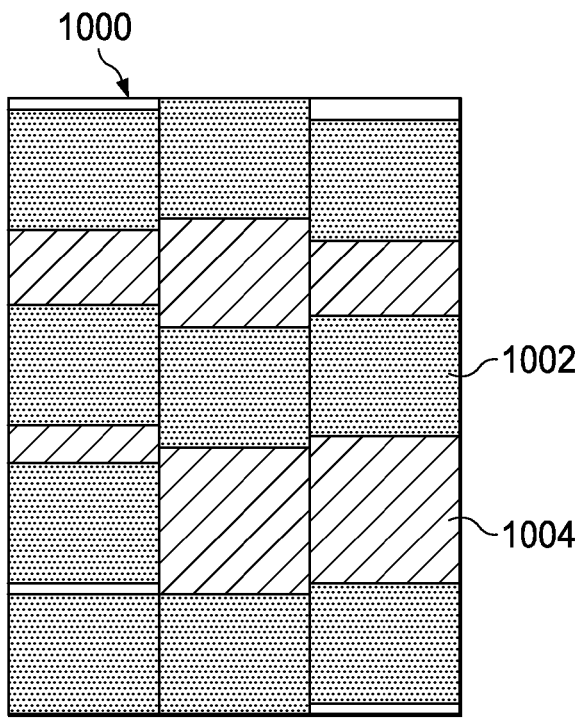
FIG. 10 is a representational illustration of a portion of an integrated circuit design, showing exemplary gate array cell availability using automatic positioning in accordance with an illustrative method for positioning gate array logic elements and gate array fill circuits.

Improved gate array density and availability resulting from the use of automatic positioning in accordance with the illustrative embodiments is shown by the representational illustration in FIG. 10 of a portion of an integrated circuit design 1000 that might be formed using such automatic positioning. Integrated circuit design 1000 includes logic cells 1002, shown in shading, that are placed arbitrarily, for example, on a single step size grid. In accordance with the illustrative embodiments, gate array circuits 1004 are positioned between adjacent logic cells 1002 with reference to the placement of the logic cells 1002. Thus, filling of the space between logic cells 1002 with gate array circuits 1004 is maximized.

Figure 11:
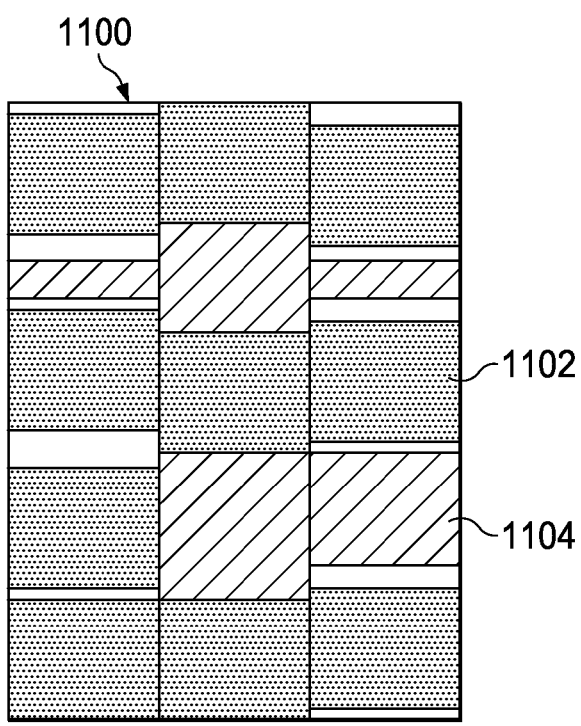
FIG. 11 is a representational illustration of a portion of an integrated circuit design, showing exemplary gate array cell availability using a traditional method for positioning gate array logic elements and gate array fill circuits.

This may be contrasted with FIG. 11 which is a representational illustration of a portion of an integrated circuit design 1100 that might be formed using prior art automatic positioning techniques. Integrated circuit design 1100 also includes arbitrarily positioned logic cells 1102. However, in accordance with prior art techniques, gate array circuits 1104 are positioned between adjacent logic cells 1102 subject to alignment to a least common multiple step size grid defined across the entire integrated circuit design 1100. This allows gate array circuits to be positioned only where cells of the least common multiple step size grid happen to align with the spaces between adjacent logic cells 1102. Thus, total gate array circuit density across the integrated circuit design 1100 is reduced, since not all potentially available space between logic cells 1102 is used for gate array circuits 1104 when the prior art placement method is employed.

Initial experimental results show an average improvement of 7% (+/−3%) in customizable logic area availability using automatic gate array placement in accordance with the illustrative embodiments as compared to automatic gate array placement using previously known techniques.

Figure 12:
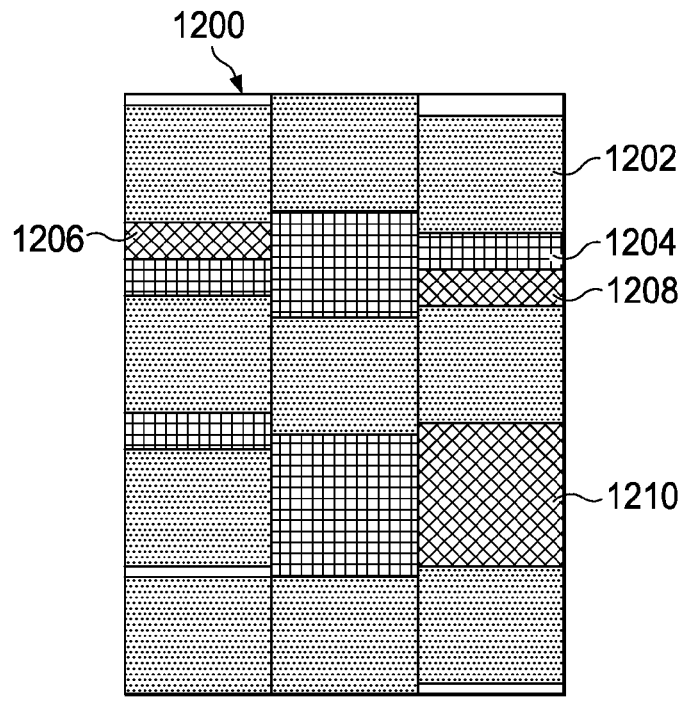
FIG. 12 is a representational illustration of a portion of an integrated circuit design, showing alignment of gate array logic elements positioned using automatic positioning in accordance with an illustrative method.
Figure 13:
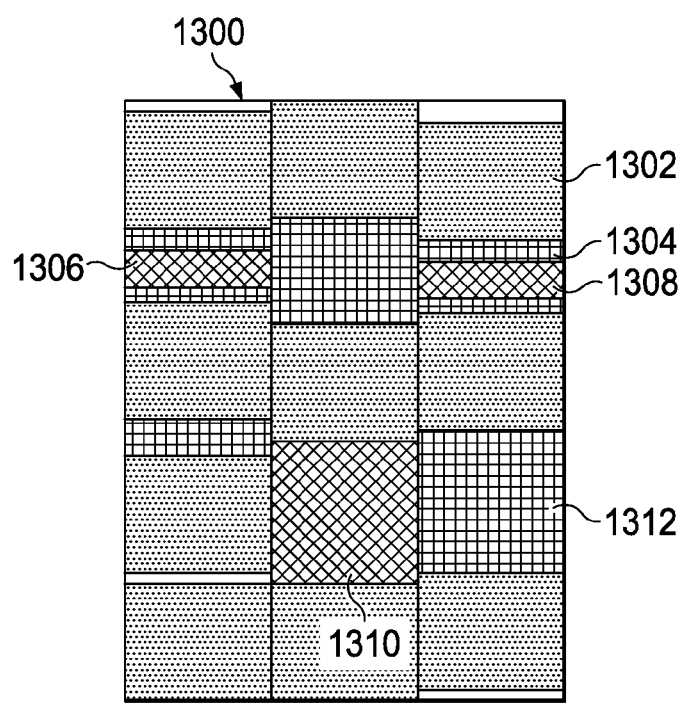
FIG. 13 is a representational illustration of a portion of an integrated circuit design, showing misalignment of gate array logic elements positioned using a traditional method for positioning gate array logic elements.

FIG. 12 and FIG. 13 are provided to illustrate how automatic placement of fully configured gate array logic elements in accordance with illustrative embodiments provides for better logic element positioning than may be provided by prior art automated logic element placement techniques. FIG. 12 and FIG. 13 each show a representational illustration of a portion of an integrated circuit design, 1200 and 1300, respectively. Integrated circuit designs 1200 and 1300 contain arbitrarily positioned logic cells 1202 and 1302, respectively. Gridded areas 1204 and 1304 represent the white space between logic cells 1202 and 1302 in the initial integrated circuit designs 1200 and 1300. In FIG. 12, gate array logic elements 1206, 1208, and 1210 are positioned using an automated placement method in accordance with the illustrative embodiments. Gate array logic elements 1206, 1208, and 1210 are each positioned between adjacent logic cells 1202 on a least common multiple step size grid defined by the space 1204 between logic cells 1202. In FIG. 13, gate array logic elements 1306, 1308, and 1310 are positioned using prior art automated circuit element placement techniques. As such, gate array logic elements 1306, 1308, and 1310 are positioned only where cells of a least common multiple step size grid defined across the entire integrated circuit design 1300 happen to align with the spaces 1304 between adjacent logic cells 1302. In this case, the least common multiple step size grid used by the prior art automated circuit element placement technique is misaligned with space 1312 between logic cells 1302. Thus, although space 1312 is large enough for large gate array logic element 1310, the prior art technique cannot position gate array logic element 1310 in that space. Instead, the prior art technique places gate array logic element 1310 in a different column of the integrated circuit design 1300, potentially far away from the best position of gate array logic element 1310 in view of timing or other circuit parameter considerations. In contrast, as shown in FIG. 12, automatic placement of gate array logic elements in accordance with the illustrative embodiments takes full advantage of available space between logic cells 1202 and is able to position large gate array logic element 1210 in any space between logic cells 1202 that is large enough to accommodate it.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with any system, apparatus, or device for running a program.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with any system, apparatus, or device for running a program.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, occur substantially concurrently, or the blocks may sometimes occur in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention provided herein has been presented for purposes of illustration and explanation, but is not intended to be exhaustive or to limit the invention to the form disclosed. Many modifications and variations will be apparent to those of ordinary skill in the art without departing from the scope and spirit of the invention. The illustrative embodiments were chosen and described in order to best explain the principles of the invention and the practical application, and to enable others of ordinary skill in the art to understand the invention for various embodiments with various modifications as are suited to the particular use contemplated.

What is claimed is:

1. An automated method for positioning gate array circuits in an integrated circuit design, the method comprising:
    providing an initial integrated circuit design including logic cells positioned aligned on a single step size grid and gate array fill circuits positioned in a space between adjacent logic cells, wherein the size of each gate array fill circuit is a multiple of a least common multiple step size, and wherein each gate array fill circuit is aligned with a least common multiple step size grid positioned between adjacent logic cells with respect to at least one of the adjacent logic cells and aligned with the single step size grid such that each least common multiple step size grid includes the maximum number of least common multiple step size grid cells that may be positioned in the space between the adjacent logic cells;
    receiving a gate array logic element design to be placed in the integrated circuit design;
    automatically determining an initial placement position for the gate array logic element at any position between adjacent logic cells in alignment with the single step size grid based on at least one circuit design consideration;
    after automatically determining the initial placement position for the gate array logic element: when the initial placement position is not aligned with the least common multiple step size grid, automatically positioning the gate array logic element in a final position aligned with the least common multiple step size grid, wherein the final position is different from the initial position by a multiple of single step size grid cells; and
    automatically positioning gate array fill circuits aligned with the least common multiple step size grid between adjacent logic cells to fill the space between adjacent logic cells unoccupied by the gate array logic element.

2. The method of claim 1, wherein the step of automatically positioning gate array fill circuits comprises:
    automatically filling the space between adjacent logic cells in the initial integrated circuit design with one or more gate array fill circuits aligned with the least common multiple step size grid to fill the maximum amount of space between adjacent logic cells that is available for gate array fill circuits.

3. The method of claim 2, wherein the step of automatically determining the gate array logic element comprises:
    identifying one or more contiguous gate array fill circuits in the initial integrated circuit design having a contiguous circuit area corresponding to a circuit area requirement of the gate array logic element; and
    replacing the identified contiguous gate array fill circuits with the gate array logic element in the integrated circuit design.

4. The method of claim 1, wherein the providing step comprises:
    positioning a plurality of logic cells aligned on the single step size grid in the integrated circuit design using an electronic design automation tool; and
    positioning one or more gate array fill circuits in the space between the adjacent logic cells and aligned with the single step size grid beginning with a single step size grid location immediately adjacent to at least one of the adjacent logic cells to fill the maximum amount of space between adjacent logic cells that is available for gate array fill circuits and thereby to define the least common multiple step size grid between the adjacent logic cells.

5. The method of claim 1, wherein the step of determining an initial placement position of the gate array logic element comprises:
making available for the initial placement position any position between adjacent logic cells in alignment with the single step size grid in which one or more gate array fill circuits are positioned in the initial integrated circuit design.

6. The method of claim 1, wherein the at least one circuit design consideration includes circuit timing considerations.

7. A computer program product including a computer readable storage device having stored thereon computer program instructions for controlling a data processing system to automatically position gate array circuits in an integrated circuit design, comprising:
computer program instructions stored on the computer readable storage medium to receive an initial integrated circuit design including logic cells positioned aligned on a single step size grid and gate array fill circuits positioned in a space between adjacent logic cells, wherein the size of each gate array fill circuit is a multiple of a least common multiple step size, and wherein each gate array fill circuit is aligned with a least common multiple step size grid positioned between adjacent logic cells with respect to at least one of the adjacent logic cells and aligned with the single step size grid such that each least common multiple step size grid includes the maximum number of least common multiple step size grid cells that may be positioned in the space between the adjacent logic cells;
computer program instructions stored on the computer readable storage medium to receive a gate array logic element design to be placed in the integrated circuit design;
computer program instructions stored on the computer readable storage medium to automatically determine an initial placement position for the gate array logic element at any position between adjacent logic cells in alignment with the single step size grid based on at least one circuit design consideration;
after automatically determining the initial placement position for the gate array logic element: when the initial placement position is not aligned with the least common multiple step size grid, computer program instructions stored on the computer readable storage medium to automatically position the gate array logic element in a final position aligned with the least common multiple step size grid, wherein the final position is different from the initial position by a multiple of single step size grid cells; and
computer program instructions stored on the computer readable storage medium to position automatically gate array fill circuits aligned with the least common multiple step size grid between adjacent logic cells to fill the space between adjacent logic cells unoccupied by the gate array logic element.

8. The computer program product of claim 7, wherein the instructions to position automatically gate array fill circuits comprises computer program instructions stored on the computer readable storage medium to:
automatically fill the space between adjacent logic cells in the initial integrated circuit design with one or more gate array fill circuits aligned with the least common multiple step size grid to fill the maximum amount of space between adjacent logic cells that is available for gate array fill circuits.

9. The computer program product of claim 8, wherein the instructions to automatically determine the gate array logic element comprises computer program instructions stored on the computer readable storage medium to:
identify one or more contiguous gate array fill circuits in the initial integrated circuit design having a contiguous circuit area corresponding to a circuit area requirement of the gate array logic element; and
replace the identified contiguous gate array fill circuits with the gate array logic element in the integrated circuit design.

10. The computer program product of claim 7, further comprising computer program instructions stored on the computer readable storage medium to:
position a plurality of logic cells aligned on the single step size grid in the integrated circuit design; and
position one or more gate array fill circuits in the space between the adjacent logic cells and aligned with the single step size grid beginning with a single step size grid location immediately adjacent to at least one of the adjacent logic cells to fill the maximum amount of space between adjacent logic cells that is available for gate array fill circuits and thereby to define the least common multiple step size grid between the adjacent logic cells.

11. The computer program product of claim 7, wherein the instructions to determine an initial placement position of the fully configured gate array logic element comprises computer program instructions stored on the computer readable storage medium to:
make available for the initial placement position any position between adjacent logic cells in alignment with the single step size grid in which one or more gate array fill circuits are positioned in the initial integrated circuit design.

12. The computer program product of claim 7, wherein the at least one circuit design consideration includes circuit timing considerations.

13. An apparatus for positioning gate array circuits in an integrated circuit design, comprising
a processor unit
configured to:
receive an initial integrated circuit design including logic cells positioned aligned on a single step size grid and gate array fill circuits positioned in a space between adjacent logic cells, wherein the size of each gate array fill circuit is a multiple of a least common multiple step size, and wherein each gate array fill circuit is aligned with a least common multiple step size grid positioned between adjacent logic cells with respect to at least one of the adjacent logic cells and aligned with the single step size grid such that each least common multiple step size grid includes the maximum number of least common multiple step size grid cells that may be positioned in the space between the adjacent logic cells;
receive a gate array logic element design to be placed in the integrated circuit design;
automatically determine an initial placement position for the gate array logic element at any position between adjacent logic cells in alignment with the single step size grid based on at least one circuit design consideration;
after automatically determine the initial placement position for the gate array logic element: when the initial placement position is not aligned with the least common multiple step size grid, automatically positioning the gate array logic element in a final position aligned with the least common multiple step size grid, wherein the final position is different from the initial position by a multiple of single step size grid cells; and position automatically gate array fill circuits aligned with the least common multiple step size grid between adjacent logic cells to fill the space between adjacent logic cells unoccupied by the gate array logic element.

14. The apparatus of claim 13, wherein the processor unit is configured to:

automatically fill the space between adjacent logic cells in the initial integrated circuit design with one or more gate array fill circuits aligned with the least common multiple step size grid to fill the maximum amount of space between adjacent logic cells that is available for gate array fill circuits.

15. The apparatus of claim 14, wherein the processor unit is configured to:

identify one or more contiguous gate array fill circuits in the initial integrated circuit design having a contiguous circuit area corresponding to a circuit area requirement of the gate array logic element; and replace the identified contiguous gate array fill circuits with the gate array logic element in the integrated circuit design.

16. The apparatus of claim 13, wherein the processor unit is configured to provide the initial integrated circuit design by:

positioning a plurality of logic cells aligned on the single step size grid in the integrated circuit design; and positioning one or more gate array fill circuits in the space between the adjacent logic cells and aligned with the single step size grid beginning with a single step size grid location immediately adjacent to at least one of the adjacent logic cells to fill the maximum amount of space between adjacent logic cells that is available for gate array fill circuits and thereby to define the least common multiple step size grid between the adjacent logic cells.

17. The apparatus of claim 13, wherein the processor unit is configured to:

make available for the initial placement position any position between adjacent logic cells in alignment with the single step size grid in which one or more gate array fill circuits are positioned in the initial integrated circuit design.

* * * * *